US008608933B2

(12) United States Patent
Paneccasio, Jr. et al.

(10) Patent No.: US 8,608,933 B2
(45) Date of Patent: Dec. 17, 2013

(54) COPPER ELECTRODEPOSITION IN MICROELECTRONICS

(75) Inventors: Vincent Paneccasio, Jr., Madison, CT (US); Richard Hurtubise, Clinton, CT (US); Xuan Lin, Northford, CT (US); Paul Figura, Orange, CT (US)

(73) Assignee: Enthone Inc., West Haven, CT (US)

( * ) Notice: Subject to any disclaimer, the term of this patent is extended or adjusted under 35 U.S.C. 154(b) by 0 days.

(21) Appl. No.: 13/214,525

(22) Filed: Aug. 22, 2011

(65) Prior Publication Data

US 2012/0043218 A1 Feb. 23, 2012

Related U.S. Application Data

(60) Division of application No. 10/963,369, filed on Oct. 12, 2004, now Pat. No. 8,002,962, and a continuation-in-part of application No. 10/091,106, filed on Mar. 5, 2002, now Pat. No. 7,316,772.

(60) Provisional application No. 60/531,771, filed on Dec. 22, 2003.

(51) Int. Cl.
C25D 3/34 (2006.01)

(52) U.S. Cl.
USPC .......................................... 205/297; 205/298

(58) Field of Classification Search
USPC ................................................. 205/297, 298
See application file for complete search history.

(56) References Cited

U.S. PATENT DOCUMENTS

| | | | |
|---|---|---|---|
| 3,682,939 A | 8/1972 | Webster | |
| 3,940,320 A | 2/1976 | Kardos et al. | |
| 3,956,078 A | 5/1976 | Kardos et al. | |
| 4,009,087 A | 2/1977 | Kardos et al. | |
| 4,036,710 A * | 7/1977 | Kardos et al. | 205/298 |
| 4,038,161 A | 7/1977 | Eckles et al. | |
| 4,096,133 A | 6/1978 | Zweigle | |
| 4,170,526 A * | 10/1979 | Creutz et al. | 205/310 |
| 4,212,764 A * | 7/1980 | Quinlan | 252/392 |
| 5,824,756 A | 10/1998 | Scriven et al. | |
| 6,444,110 B2 | 9/2002 | Barstad et al. | |
| 2003/0085133 A1 | 5/2003 | Totsuka et al. | |
| 2003/0168343 A1 | 9/2003 | Commander et al. | |
| 2004/0187731 A1* | 9/2004 | Wang et al. | 106/1.13 |
| 2005/0045486 A1 | 3/2005 | Sahoda et al. | |
| 2005/0072683 A1 | 4/2005 | Nakada et al. | |

FOREIGN PATENT DOCUMENTS

| | | |
|---|---|---|
| DE | 10100954 A1 * | 7/2002 |
| GB | 1433040 | 4/1976 |
| JP | 52007819 | 1/1977 |
| SU | 980412 | 2/1987 |
| SU | 980412 A * | 2/1987 |

OTHER PUBLICATIONS

Raschig, Chemical Catalog, p. 26, Feb. 28, 2001.
Product Data Sheet, RALU PLATE LEV 170, May 11, 2002.
Abstract of JP52007819; 1977-01-21.

(Continued)

*Primary Examiner* — Edna Wong
(74) *Attorney, Agent, or Firm* — Senniger Powers LLP

(57) ABSTRACT

A method and composition for electroplating Cu onto a substrate in the manufacture of a microelectronic device. The plating composition comprises an electrolytic solution containing a source of Cu ions and a substituted pyridyl polymer compound for leveling.

13 Claims, 11 Drawing Sheets

(56) References Cited

OTHER PUBLICATIONS

Abstract of SU980412; 1987-02-15.

International Search Report and Written Opinion, PCT/US04/41620, dated Mar. 8, 2005, 13 pages.

European Supplemental Search Report, EP04813876, dated Apr. 11, 2008, 2 pages.

* cited by examiner

COPPER ELECTRODEPOSITION IN MICROELECTRONICS

CROSS-REFERENCE TO RELATED APPLICATION

This application is a divisional of application Ser. No. 10/963,369, filed Oct. 12, 2004, now U.S. Pat. No. 8,002,962, issued Aug. 23, 2011, which claims priority from U.S. application Ser. No. 60/531,771, filed Dec. 22, 2003. Application Ser. No. 10/963,369 is a continuation-in-part of U.S. Ser. No. 10/091,106, filed Mar. 5, 2002, now U.S. Pat. No. 7,316,772, the entire disclosures of which are expressly incorporated by reference.

BACKGROUND OF THE INVENTION

This invention relates to a method, compositions, and additives for electrolytic Cu metallization in the field of microelectronics manufacture.

Electrolytic Cu metallization is employed in the field of microelectronics manufacture to provide electrical interconnection in a wide variety of applications, such as, for example, in the manufacture of semiconductor integrated circuit (IC) devices. The demand for manufacturing semiconductor IC devices such as computer chips with high circuit speed and high packing density requires the downward scaling of feature sizes in ultra-large-scale integration (ULSI) and very-large-scale integration (VLSI) structures. The trend to smaller device sizes and increased circuit density requires decreasing the dimensions of interconnect features. An interconnect feature is a feature such as a via or trench formed in a dielectric substrate which is then filled with metal to yield an electrically conductive interconnect. Further decreases in interconnect size present challenges in metal filling.

Copper has been introduced to replace aluminum to form the connection lines and interconnects in semiconductor substrates. Copper has a lower resistivity than aluminum and the thickness of a Cu line for the same resistance can be thinner than that of an aluminum line. Copper can be deposited on substrates by plating (such as electroless and electrolytic), sputtering, plasma vapor deposition (PVD), and chemical vapor deposition (CVD). It is generally recognized electrochemical deposition is the best method to apply Cu since it can provide high deposition rates and offer low cost of ownership.

Copper plating methods must meet the stringent requirements of the semiconductor industry. For example, Cu deposits must be uniform and capable of flawlessly filling the small interconnect features of the device, for example, with openings of 100 nm or smaller.

Electrolytic Cu systems have been developed which rely on so-called "superfilling" or "bottom-up growth" to deposit Cu into high aspect ratio features. Superfilling involves filling a feature from the bottom up, rather than at an equal rate on all its surfaces, to avoid seams and pinching off that can result in voiding. Systems consisting of a suppressor and an accelerator as additives have been developed for superfilling. As the result of momentum of bottom-up growth, the Cu deposit is thicker on the areas of interconnect features than on the field area that does not have features. These overgrowth regions are commonly called overplating, mounding, bumps, or humps. Smaller features generate higher overplating humps due to faster superfill speed. The overplating poses challenges for later chemical and mechanical polishing processes that planarize the Cu surface.

To control overplating, a third additive component called leveler is introduced to create surface "leveling," i.e., to reduce the momentum of bottom-up growth created by accelerator and suppressor. Although a leveler creates a more planar Cu surface, it is commonly recognized that leveler can have negative impact on the bottom-up growth, especially at high leveler concentration that can slow the superfilling growth rate. A common practice is to use leveler within a tight concentration window that strikes a compromise between the overplating and superfilling performances.

As chip architecture gets smaller, with interconnects having openings on the order of 100 nm and smaller through which Cu must grow to fill the interconnects, there is a need for enhanced bottom-up speed. That is, the Cu must fill "faster" in the sense that the rate of growth in the vertical direction must be substantially greater (e.g., 50%, 75%, or more) than the rate of growth in the horizontal direction, and even more so than in conventional superfilling of larger interconnects. However, the extraordinary speed of bottom-up growth on these fine structures generates significantly large dimension of overplating humps that require more leveler to level. But to further increase leveler concentration reduces superfilling speed that is especially critical for these fine interconnect structures.

In addition to superfilling and overplating issues, microdefects may form when electrodepositing Cu for filling interconnect features. One defect that can occur is the formation of internal voids inside the features. As Cu is deposited on the feature side walls and top entry of the feature, deposition on the side walls and entrance to the feature can pinch off and thereby close access to the depths of the feature especially with features which are small (e.g., <100 nm) and/or which have a high aspect ratio (depth:width). An internal void can form in the feature if Cu solution flow into the feature is closed off during the electrolytic process. An internal void can interfere with electrical connectivity through the feature.

Microvoids are another type of defect which can form during or after electrolytic Cu deposition due to uneven Cu growth or grain recrystallization that happens after Cu plating.

In a different aspect, some local areas of a semiconductor substrate, typically areas where there is a Cu seed layer deposited by physical vapor deposition, may not grow Cu during the electrolytic deposition, resulting in pits or missing metal defects. These Cu voids are considered to be "killer defects," as they reduce the yield of semiconductor manufacturing. Multiple mechanisms contribute to the formation of these Cu voids, including the semiconductor substrate itself. However, Cu electroplating chemistry has influence on the occurrence and population of these defects.

Other defects are surface protrusions, which are isolated deposition peaks occurring at localized high current density sites, localized impurity sites, or otherwise. Copper plating chemistry has influence on the occurrence of such protrusion defects. Although not considered as defects, Cu surface roughness is also important for semiconductor wafer manufacturing. Generally, a bright Cu surface is desired as it can reduce the swirl patterns formed during wafer entry in the plating solution. Roughness of Cu deposits makes it more difficult to detect defects by inspection, as defects may be concealed by peaks and valleys of rough surface topography. Moreover, smooth growth of Cu is becoming more important for flawlessly filling of fine interconnect structures as the roughness can cause pinch off of feature and thereby close access to the depths of the feature. It is generally recognized that Cu plating chemistry has great influence on the roughness of Cu deposits, through combined effects of additive components, especially leveler. From this perspective, judicious use of leveler can result in better superfilling performance.

SUMMARY OF THE INVENTION

Briefly, therefore, the invention is directed to a method for electroplating Cu onto a substrate in the manufacture of a microelectronic device comprising immersing the substrate in an electrolytic solution containing Cu in an amount sufficient to electrodeposit Cu onto the substrate and a leveling agent comprising a substituted pyridyl polymer compound, and supplying electrical current to the electrolytic solution to deposit Cu onto the substrate.

In another aspect the invention is directed to a composition for electroplating Cu onto a substrate in the manufacture of a microelectronic device, the composition comprising a source of Cu ions and a leveling agent comprising a substituted pyridyl polymer compound.

Other objects and features of the invention will be in part apparent and in part pointed out hereinafter.

DETAILED DESCRIPTION

Figure 1:
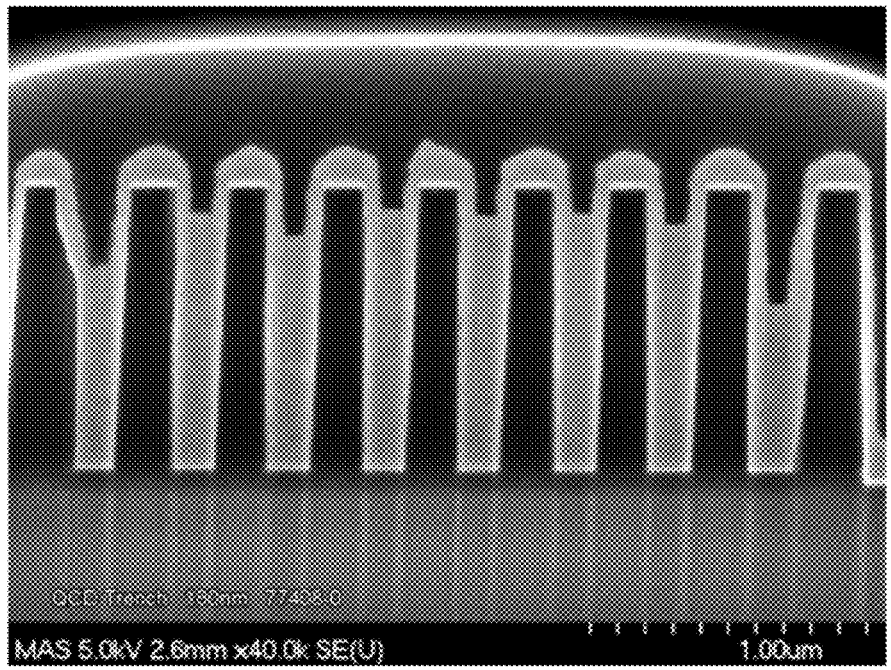
FIG. 1 is an SEM image of a cross-section of a wafer plated according to the method described in Example 24.

In accordance with this invention, an additive based on substituted pyridyl compounds is incorporated into an electroplating bath for Cu plating in the manufacture of microelectronics. In one embodiment, the electroplating bath is for use in depositing Cu onto a semiconductor IC device substrate such as a silicon wafer, including Cu filling of interconnect features.

A significant advantage of the additive of the invention is an enhanced leveling effect without substantially interfering with superfilling of Cu into high aspect ratio features. That is, because the leveler of the invention does not substantially interfere with superfilling, the Cu bath can be formulated with a combination of accelerator and suppressor additives which provides a rate of growth in the vertical direction which is substantially greater than the rate of growth in the horizontal direction, and even more so than in conventional superfilling of larger interconnects. The compositions of the invention address the increase in risk of mounding which typically occurs as the rate of superfilling is increased. The additive also appears to have advantages in terms of reducing defects, increasing brightness, minimizing overplating, improving uniformity, and reducing underplating in some large features.

The leveler of the invention is a substituted pyridyl compound selected from among those which are soluble in a Cu plating bath, retain their functionality under electrolytic conditions, do not yield deleterious by-products under electrolytic conditions (at least neither immediately nor shortly thereafter), and yield the desired leveling effect. In one such embodiment the leveler is a pyridinium compound and, in particular, a quaternized pyridinium salt. A pyridinium compound is a compound derived from pyridine in which the nitrogen atom of the pyridine is protonated. A quaternized pyridinium salt is distinct from pyridine, and quaternized pyridinium salt-based polymers are distinct from pyridine-based polymers, in that the nitrogen atom of the pyridine ring is quaternized in the quaternized pyridinium salt and quaternized pyridinium salt-based polymers. The levelers of the invention include derivatives of a vinyl pyridine, such as derivatives of 2-vinyl pyridine and, in certain preferred embodiments, derivatives of 4-vinyl pyridine. The leveler compound polymers of the invention encompass homo-polymers of vinyl pyridine, co-polymers of vinyl pyridine, quaternized salts of vinyl pyridine, and quaternized salts of these homo-polymers and co-polymers. Some specific examples of such compounds include, for example, poly(4-vinyl pyridine), the reaction product of poly(4-vinyl pyridine) with dimethyl sulfate, the reaction product of 4-vinyl pyridine with 2-chloroethanol, the reaction product of 4-vinyl pyridine with benzylchloride, the reaction product of 4-vinyl pyridine with allyl chloride, the reaction product of 4-vinyl pyridine with 4-chloromethylpyridine, the reaction product of 4-vinyl pyridine with 1,3-propane sultone, the reaction product of 4-vinyl pyridine with methyl tosylate, the reaction product of 4-vinyl pyridine with chloroacetone, the reaction product of 4-vinyl pyridine with 2-methoxyethoxymethylchloride, the reaction product of 4-vinyl pyridine with 2-chloroethylether, the reaction product of 2-vinyl pyridine with methyl tosylate, the reaction product of 2-vinyl pyridine with dimethyl sulfate, the reaction product of vinyl pyridine and a water soluble initiator, poly(2-methyl-5-vinyl pyridine), and 1-methyl-4-vinylpyridinium trifluoromethyl sulfonate, among others. An example of a co-polymer is vinyl pyridine co-polymerized with vinyl imidazole.

The molecular weight of the substituted pyridyl polymer compound additives of the invention in one embodiment is on the order of about 160,000 g/mol or less. While some higher molecular weight compounds are difficult to dissolve into the electroplating bath or to maintain in solution, other higher molecular weight compounds are soluble due to the added solubilizing ability of the quaternary nitrogen cation. The concept of solubility in this context is reference to relative solubility, such as, for example, greater than 60% soluble, or some other minimum solubility that is effective under the circumstances. It is not a reference to absolute solubility. The foregoing preference of 160,000 g/mol or less in certain embodiments is not narrowly critical. The substituted pyridyl polymers selected are soluble in a Cu plating bath, retain their functionality under electrolytic conditions, and do not yield deleterious by-products under electrolytic conditions, at least neither immediately nor shortly thereafter.

Homo polymers of poly(4-vinyl pyridine) are available commercially. A poly(4-vinyl pyridine) with an average molecular weight of from 10,000 to 20,000 with a mean of 16,000 is available from Reilly Industries, Inc. under the trade designation Reilline 410 Solution SOQ. Additionally, poly(4-vinyl pyridines) with average molecular weights of about 60,000 and 160,000 are available from Aldrich Chemical Company.

In those embodiments where the leveler compound is a reaction product of a vinyl pyridine or poly(vinyl pyridine), it is obtained by causing a vinyl pyridine or poly(vinyl pyridine) to react with an alkylating agent selected from among those which yield a product which is soluble, bath compatible, and effective for leveling. In one embodiment candidates are selected from among reaction products obtained by causing vinyl pyridine or poly(vinyl pyridine) to react with a compound of formula 1:

R$_1$—L     (1)

wherein R$_1$ is alkyl, alkenyl, aralkyl, heteroarylalkyl, substituted alkyl, substituted alkenyl, substituted aralkyl or substituted heteroarylalkyl; and L is a leaving group.

A leaving group is any group that can be displaced from a carbon atom. In general, weak bases are good leaving groups. Exemplary leaving groups are halides, methyl sulfate, tosylates, and the like.

In another embodiment, R$_1$ is alkyl or substituted alkyl; preferably, R$_1$ is substituted or unsubstituted methyl, ethyl, straight, branched or cyclic propyl, butyl, pentyl or hexyl; in one embodiment R$_1$ is methyl, hydroxyethyl, acetylmethyl, chloroethoxyethyl or methoxyethoxymethyl.

In a further embodiment, R$_1$ is alkenyl; preferably, R$_1$ is vinyl, propenyl, straight or branched butenyl, straight, branched or cyclic pentenyl or straight, branched, or cyclic hexenyl; in one embodiment R$_1$ is propenyl.

In yet another embodiment, R$_1$ is aralkyl or substituted aralkyl; preferably, R$_1$ is benzyl or substituted benzyl, naphthylalkyl or substituted naphthylalkyl; in one

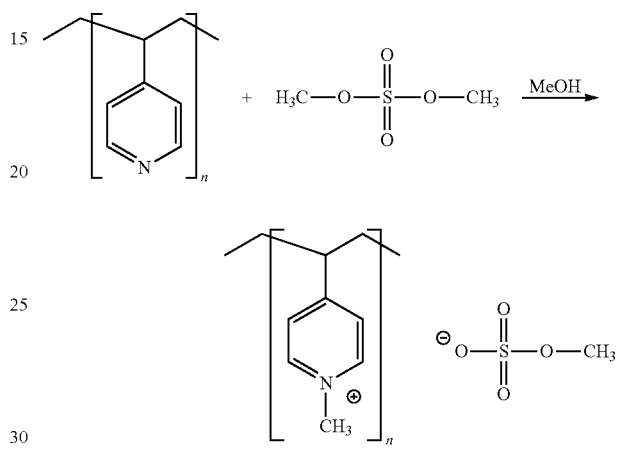

embodiment R$_1$ is benzyl or naphthylmethyl.

In still another embodiment, R$_1$ is heteroarylalkyl or substituted heteroarylalkyl; preferably, R$_1$ is pyridylalkyl; particularly, R$_1$ is pyridylmethyl.

In a further embodiment, L is chloride, methyl sulfate (CH$_3$SO$_4^-$), octyl sulfate (C$_8$H$_{18}$SO$_4^-$), trifluoromethanesulfonate (CF$_3$SO$_3^-$), chloroacetate (CH$_2$ClC(O)O$^-$), or tosylate (C$_7$H$_7$SO$_3^-$); preferably, L is methyl sulfate, chloride or tosylate.

In one such embodiment the leveler compound is poly(1-methyl-4-vinylpyridinium methyl sulfate) obtained by reacting poly(4-vinyl pyridine) with dimethyl sulfate as follows:

Water soluble initiators can be used to prepare polymers of vinyl pyridine, though they are not used in the currently preferred embodiments or in the working examples. Exemplary water soluble initiators are peroxides (e.g., hydrogen peroxide, benzoyl peroxide, peroxybenzoic acid, etc.) and the like, and water soluble azo initiators such as 4,4'-Azobis(4-cyanovaleric acid).

In a further embodiment, the leveler constitutes a component of a mixture of one of the above-described polymers with a quantity of a monomer which is, for example, a monomeric vinyl pyridine derivative compound. In one such embodiment, the mixture is obtained by quaternizing a monomer to yield a quaternized salt which then undergoes spontaneous polymerization. The quaternized salt does not completely polymerize; rather, it yields a mixture of the monomer and spontaneously generated polymer. In a currently preferred embodiment, 4-vinyl pyridine is quaternized by reaction with dimethyl sulfate, and spontaneous polymerization occurs according to the following reaction scheme (45-65° C.):

This represents the materials of Example 4 reacted according to Method 3 of Example 1 hereinbelow. The monomer fraction is increased with an increase in amount of

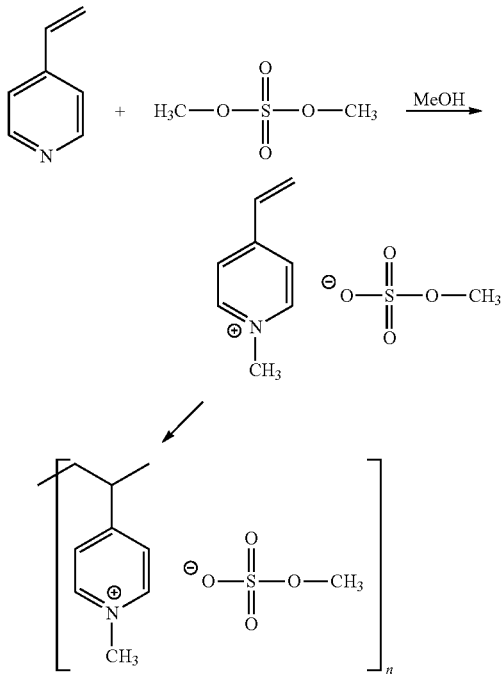

methanol used in the quaternization reaction; that is, the degree of spontaneous polymerization is decreased. While the resulting leveler system is a mixture of the polymer and the monomer, it preliminarily appears that only the polymer actively performs leveling function.

The active ingredient of the substituted pyridyl polymer compounds are incorporated into the electroplating bath at concentrations of about 0.01 mg/L to about 100 mg/L. In this regard, the active ingredient is a homo-polymer of vinyl pyridine, a co-polymer of vinyl pyridine, a quaternized salt of vinyl pyridine, and/or a quaternized salt of these homo-polymers and co-polymers. The active ingredient does not include the inactive anion associated with the quaternized salts. In one embodiment, the active ingredients of the compounds are present in the bath at concentrations of between about 0.1 mg/L (0.4 micromole/L) and about 25 mg/L (108 micromole/L) or higher.

While the substituted pyridyl polymers of the invention can be used in a variety of electroplating baths, in one embodiment it is preferred to use them in combination with particular suppressors and accelerators as disclosed in co-assigned U.S. Pat. No. 6,776,893, the entire disclosure of which is expressly incorporated herein by reference. In such a system, a preferred suppressor is a bath soluble polyether compound selected from the group consisting of block copolymers of polyoxyethylene and polyoxypropylene, a polyoxyethylene or polyoxypropylene derivative of a polyhydric alcohol and a mixed polyoxyethylene and polyoxypropylene derivative of a polyhydric alcohol. The polyether suppressor compounds are incorporated typically in a concentration between about 0.02 and about 2 g/L, more typically between about 0.04 and about 1.5 g/L, and even more typically between about 0.1 and 1 g/L. Especially preferred suppressors include polyether compounds represented by Formulae 2, 3 and 4.

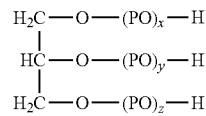

Formula 2

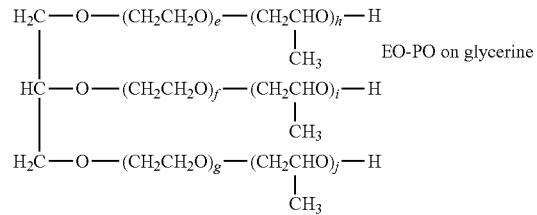

Formula 3
EO-PO on glycerine

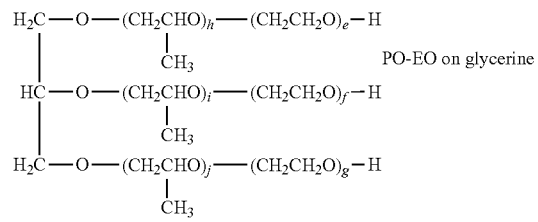

Formula 4
PO-EO on glycerine wherein x+y+z is 3 to 100, and wherein e+f+g and h+i+j are each 5 to 100.

One especially preferred suppressor is a polyoxyethylene/polyoxypropylene block copolymer of ethylenediamine

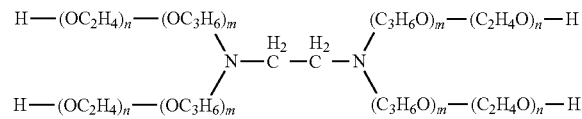

wherein the molecular weight of the polyoxypropylene (hydrophobe) is about 2500-3000 and of the polyoxyethylene (hydrophylic unit) is about 2500-3000. The molecular weight of the polymer is about 5500. This polymer is available from BASF Corporation of Mt. Olive, N.J. under the trade designation Tetronic® 704.

With regard to accelerators, in a system currently preferred by the applicants the accelerators are bath soluble organic divalent sulfur compounds corresponding to the formula $$R_1-(S)_n RXO_3 M \qquad (5)$$

wherein
M is hydrogen, alkali metal or ammonium as needed to satisfy the valence;
X is S or P;
R is an alkylene or cyclic alkylene group of 1 to 8 carbon atoms, an aromatic hydrocarbon or an aliphatic aromatic hydrocarbon of 6 to 12 carbon atoms;
n is 1 to 6; and
$R_1$ is selected from the group of
$MO_3XR$ wherein M, X and R are as defined above,
a thiocarbamate represented by the formula

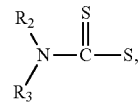

a xanthate represented by the formula,

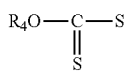

and
an aminoimine represented by the formula

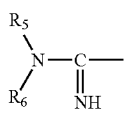

wherein $R_2$, $R_3$, $R_4$, $R_5$ and $R_6$ are independently hydrogen, an alkyl group of 1 to 4 carbon atoms, a heterocyclic group, or an aromatic group.

Especially preferred accelerators include bath soluble organic divalent sulfur compounds corresponding to Formula 5 above wherein $R_1$ is $MO_3XR$ wherein M, X and R are as defined above or a thiocarbamate represented by the formula

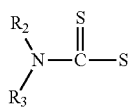

wherein $R_2$ and $R_3$ are independently hydrogen, an alkyl group of 1 to 4 carbon atoms, a heterocyclic group or an aromatic group.

An accelerator which is especially preferred is 1-propanesulfonic acid, 3,3'-dithiobis, disodium salt according to the following formula:

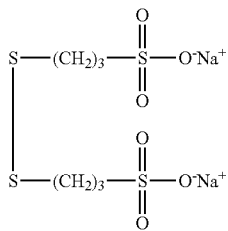

The accelerator is incorporated typically in a concentration between about 0.5 and about 1000 mg/L, more typically between about 5 and about 50 mg/L, and even more typically between about 5 and 30 mg/L.

Optionally, additional leveling compounds of the following types can be incorporated into the bath such as the reaction product of benzyl chloride and hydroxyethyl polyethylenimine as disclosed in U.S. Patent Publication No. 20030168343, the entire disclosure of which is expressly incorporated herein by reference.

While the incorporation of such suppressors, accelerators, and leveling compounds is not critical to the efficacy of the compounds of this invention, at this time the best overall deposit and feature fill is believed to be achieved thereby.

One preferred Cu deposition bath comprises a makeup solution, which contains about 40 g/L Cu as $CuSO_4$, about 10 g/L $H_2SO_4$, and about 50 ppm $Cl^-$. This preferred overall bath further comprises about 2 ml/L (200 ppm) suppressor available from Enthone under the designation ViaForm® suppressor, about 6 ml/L (12 ppm) accelerator available from Enthone under the designation ViaForm® accelerator, and about 2.5 ml/L (4 ppm) leveler available from Enthone under the designation ViaForm® leveler. To this bath is also added the substituted pyridyl polymer of the present invention.

The substituted pyridyl polymer compound of the invention in the foregoing concentrations and combinations has been discovered to provide an enhanced leveling effect without substantially interfering with superfilling of Cu into high aspect ratio features. The additive also appears to have advantages in terms of reducing defects, increasing brightness, minimizing overplating, improving uniformity, and reducing underplating in some large features.

An advantage of the substituted pyridyl polymer additives of the invention is the reduction in the occurrence of internal voids as compared to deposits formed from a bath not containing these compounds. Internal voids form from Cu depositing on the feature side walls and top entry of the feature, which causes pinching off and thereby closes access to the depths of the feature. This defect is observed especially with features which are small (e.g., <100 nm) and/or which have a high aspect ratio (depth:width), for example, >4:1. As access to the feature by Cu is inhibited or closed off, an internal void can be left in the feature, thereby interfering with electrical connectivity through the feature. The compounds of the invention appear to reduce the incidence of internal voids because the compounds interfere less with superfilling than do other levelers, such that the incidence of closing off of high aspect ratio features is reduced.

As a general proposition, because there is less interference with superfilling, leveling can be pursued more aggressively. This is an especially valuable benefit as chip architecture gets smaller, because with interconnect dimensions down at sizes on the order of 100 nm and smaller, faster superfilling is required in the sense that a much greater rate of vertical deposition as compared to a rate of horizontal deposition is required, and planarity problems and the need for leveling are exacerbated. The present leveler allows one to accelerate the superfilling rate by use of accelerator/suppressor combination chemistry which would ordinarily result in excessive mounding.

Another advantage of the compositions of the invention is the reduction of Cu voids such as missing metal defects and microvoids. These defects reduce the yield and reliability of semiconductor IC devices.

Another advantage of the compounds of the invention is the reduction of general surface roughness on the substrate surface and within interconnect features. Reducing surface roughness is becoming increasingly important to achieve flawless fill of fine interconnect structures as rough Cu growth can potentially pinch off feature entrance, leaving internal voids.

Another advantage of the leveling agents of the invention is the decrease in the occurrence of surface protrusions, which are isolated deposition peaks occurring at localized high current density sites, localized impurity sites, or otherwise. The occurrence of these protrusions is reduced as compared to a Cu deposit formed from a bath that does not contain the compounds of the invention.

A further significant advantage of the compounds of the invention is due to the decrease in dimension of overplating and improved uniformity, which enables deposition of thinner Cu films to achieve planar surfaces, thus less material has to be removed in post-deposition operations. For example, chemical mechanical polishing (CMP) is used after electrolytic Cu deposition to reveal the underlying features. The more level deposit of the invention corresponds to a reduction in the amount of metal which must be deposited, therefore resulting in less removal later by CMP. There is a reduction in the amount of scrapped metal and, more significantly, a reduction in the time required for the CMP operation. The material removal operation is also less severe which, coupled with the reduced duration, corresponds to a reduction in the tendency of the material removal operation to impart defects. In this regard, for many of the various embodiments described above, deposition of Cu includes the deposition of Cu alloys.

The Cu electroplating bath may vary widely depending on the substrate to be plated and the type of Cu deposit desired. The electrolytic baths include acid baths and alkaline baths. A variety of Cu electroplating baths are described in the book entitled Modern Electroplating, edited by F. A. Lowenheim, John Reily & Sons, Inc., 1974, pages 183-203. Exemplary baths include Cu fluoroborate, Cu pyrophosphate, Cu cyanide, Cu phosphonate, and other Cu metal complexes such as methane sulfonic acid. The most typical Cu electroplating bath comprises Cu sulfate in an acid solution.

The concentration of Cu and acid may vary over wide limits; for example, from about 4 to about 70 g/L Cu and from about 2 to about 225 g/L acid. In this regard the compounds of the invention are suitable for use in both high acid/low Cu systems, and in low acid/high Cu systems. In high acid/low Cu systems, the Cu ion concentration can be on the order of 4 g/L to on the order of 30 g/L; and the acid concentration may be sulfuric acid in an amount of greater than about 50 up to about 225 g/L. In one high acid/low Cu system, the Cu ion concentration is about 17 g/L where the $H_2SO_4$ concentration is about 180 g/L. In low acid/high Cu systems, the Cu ion concentration can be on the order of greater than about 30, 40, and even up to on the order of 55 g/L Cu (greater than 50 g/L Cu corresponds to greater than 200 g/L $CuSO_4$-$5H_2O$ Cu sulfate pentahydrate). The acid concentration in these systems is less than 50, 40, and even 30 g/L $H_2SO_4$, down to about 7 g/L. In one exemplary low acid/high Cu system, the Cu concentration is about 40 g/L and the $H_2SO_4$ concentration is about 10 g/L.

Chloride ion may also be used in the bath at a level up to 200 mg/L, preferably about 1 to 90 mg/L. The bath also preferably contains an organic additive system such as accelerator, suppressor, and leveler.

A large variety of additives may typically be used in the bath to provide desired surface finishes for the Cu plated metal. Usually more than one additive is used with each additive forming a desired function. The additives are generally used to initiate bottom-up filling of interconnect features as well as for improved metal plated appearance (brightness), structure and physical properties such as electrical conductivity. Particular additives (usually organic additives) are used for grain refinement, suppression of dendritic growth, and improved covering and throwing power. Typical additives used in electroplating are discussed in a number of references including Modern Electroplating, cited above. A particularly desirable additive system uses a mixture of aromatic or aliphatic quaternary amines, polysulfide compounds, and polyethers. Other additives include items such as selenium, tellurium, and sulfur compounds.

Plating equipment for plating semiconductor substrates are well known and are described in, for example, Haydu et al. U.S. Pat. No. 6,024,856. Plating equipment comprises an electroplating tank which holds Cu electrolyte and which is made of a suitable material such as plastic or other material inert to the electrolytic plating solution. The tank may be cylindrical, especially for wafer plating. A cathode is horizontally disposed at the upper part of tank and may be any type substrate such as a silicon wafer having openings such as trenches and vias. The wafer substrate is typically coated with a seed layer of Cu or other metal to initiate plating thereon. A Cu seed layer may be applied by chemical vapor deposition (CVD), physical vapor deposition (PVD), or the like. An anode is also preferably circular for wafer plating and is horizontally disposed at the lower part of tank forming a space between the anode and cathode. The anode is typically a soluble anode.

These bath additives are useful in combination with membrane technology being developed by various tool manufacturers. In this system, the anode may be isolated from the organic bath additives by a membrane. The purpose of the separation of the anode and the organic bath additives is to minimize the oxidation of the organic bath additives.

The cathode substrate and anode are electrically connected by wiring and, respectively, to a rectifier (power supply). The cathode substrate for direct or pulse current has a net negative charge so that Cu ions in the solution are reduced at the cathode substrate forming plated Cu metal on the cathode surface. An oxidation reaction takes place at the anode. The cathode and anode may be horizontally or vertically disposed in the tank.

During operation of the electroplating system, Cu metal is plated on the surface of a cathode substrate when the rectifier is energized. A pulse current, direct current, reverse periodic current, or other suitable current may be employed. The temperature of the electrolyte may be maintained using a heater/cooler whereby electrolyte is removed from the holding tank and flows through the heater/cooler and then is recycled to the holding tank.

It is an optional feature of the process that the plating system be controlled as described in U.S. Pat. No. 6,024,856 by removing a portion of the electrolyte from the system when a predetermined operating parameter (condition) is met and new electrolyte is added to the system either simultaneously or after the removal in substantially the same amount. The new electrolyte is preferably a single liquid containing all the materials needed to maintain the electroplating bath and system. The addition/removal system maintains a steady-state constant plating system having enhanced plating effects such as constant plating properties. With this system and method the plating bath reaches a steady state where bath components are substantially a steady-state value.

Electrolysis conditions such as electric current concentration, applied voltage, electric current density, and electrolyte temperature are essentially the same as those in conventional electrolytic Cu plating methods. For example, the bath temperature is typically about room temperature such as about 20-27° C., but may be at elevated temperatures up to about 40° C. or higher. The current density is typically up to about 100 amps per square foot (ASF) typically about 2 to 460 ASF. It is preferred to use an anode to cathode ratio of about 1:1, but this may also vary widely from about 1:4 to 4:1. The process also uses mixing in the electroplating tank which may be supplied by agitation or preferably by the circulating flow of recycle electrolyte through the tank. The flow through the electroplating tank provides a typical residence time of electrolyte in the tank of less than about 1 minute, more typically less than 30 seconds, e.g., 10-20 seconds.

The following examples illustrate the invention.

Example 1

Synthetic Methods

Method 1:

The pyridine starting material (0.1 mol) listed below was dissolved in approximately 50 mL of chloroform in a round bottom flask. The reagent ($R_1L$) (0.105 mol) listed below was added slowly, with stirring, to the starting material solution. After the reagent ($R_1L$) was added, the mixture was heated to reflux until the reaction was considered complete. After heating, the chloroform was removed by rotary evaporation and the product was worked up by an appropriate method depending on its physical and chemical characteristics. The product was brought to a final volume in a 100 mL volumetric flask with deionized water. A further dilution was performed to bring the active material to a final concentration of 750 mg/L.

Method 2:

The pyridine starting material (0.1 mol) was added to approximately 50 mL of water in a round bottom flask. The reagent ($R_1L$) (0.105 mol) was added slowly, with stirring, to the starting material solution. Depending on the alkylating agent, the initial reaction was accompanied by an exotherm. After the reagent ($R_1L$) was added at 35° C., the mixture was heated to reflux for one hour. After heating, the product was brought to a final volume in a 100 mL volumetric flask with deionized water. A further dilution was performed to bring the active material to a final concentration of 750 mg/L.

Method 3:

The pyridine starting material (0.1 mol) was dissolved in approximately 50 mL of anhydrous methanol in a round bottom flask. The alkylating agent (0.105 mol) was added slowly, with stirring, to the starting material solution, while the temperature was no greater than 35° C. After the reagent ($R_1L$) was added, about 2 grams of water was added and the mixture was slowly heated to 65-70° C. to hydrolyze any residual, e.g., dimethyl sulfate or methyl tosylate. The mixture was heated for several hours until the reaction was considered substantially complete. The methanol was removed by rotary evaporation; but it is acceptable to allow it to remain. The product was brought to a final volume in a 100 mL volumetric flask with deionized water. This method can be used to obtain a product which is mixture of a low molecular weight polymer and a monomer. A further dilution was performed to bring the active material to a final concentration of 750 mg/L.

Method 4:

The pyridine starting material (0.1 mol) was placed in a round bottom flask. The reagent ($R_1L$) (0.105 mol) was added slowly, with stirring, to the starting material. After the reagent ($R_1L$) was added, the mixture was heated to 105-140° C. until the reaction was substantially complete. After reacting, the product was brought to a final volume in a 100 mL volumetric flask with deionized water. A further dilution was performed to bring the active material to a final concentration of 750 mg/L.

Method 5:

The pyridine starting material (0.1 mol) was dissolved in approximately 25 mL of ethylene glycol in a round bottom flask. The reagent ($R_1L$) (0.2 mol) was added slowly, with stirring, to the starting material solution. After the alkylating agent was added, the mixture was slowly heated to 105° C. and then brought to 130-140° C. The mixture was heated for several hours at 130-140° C. until the reaction was substantially complete. As much of the reagent ($R_1L$) as possible was removed by rotary evaporation. The product was brought to a final volume in a 100 mL volumetric flask with deionized water. A further dilution was performed to bring the active material to a final concentration of 750 mg/L.

U.S. Pat. Nos. 4,212,764 and 5,824,756 also disclose polyvinylpyridine polymerization.

Examples 2-17

The following pyridine starting materials and reagents ($R_1L$) were reacted following the methods above as indicated. The product activity in the Cu plating bath indicates the relative ability of the product to produce an acceptable Cu deposit upon electrolytic deposition.

| Example | Pyridine Starting Material | Reagent ($R_1L$) | Synthetic Method | Product Activity in Cu bath |
|---|---|---|---|---|
| 2 | Poly(4-vinyl pyridine) | $Me_2SO_4$ | Method 3 | Very active |
| 3 | Poly(4-vinyl pyridine) | methyl tosylate | Method 3 | Very active |
| 4 | 4-vinyl pyridine | $Me_2SO_4$ | Method 1 and Method 3 | Very active; exothermic at room temp |
| 5 | 4-vinyl pyridine | BzCl | Method 1 | Very active |
| 6 | 4-vinyl pyridine | Allyl chloride | Method 1 | Very active |
| 7 | 4-vinyl pyridine | 2-chloro-ethanol | Method 5 | Very active |
| 8 | 4-vinyl pyridine | Epichlorohydrin | Method 2 | Gel produced; exothermic after heating |
| 9 | 4-vinyl pyridine | 1-chloromethyl-naphthalene | Method 1 | Insoluble in $H_2O$ |
| 10 | 4-vinyl pyridine | 4-chloromethyl-pyridine | Method 1 | Relatively less active |
| 11 | 4-vinyl pyridine | 1,3-propane sultone | Method 1 | Relatively less active; exothermic above room temper |
| 12 | 4-vinyl pyridine | methyl tosylate | Method 2 and Method 3 | Very active; exothermic after heating |
| 13 | 4-vinyl pyridine | chloro-acetone | Method 1 | Very active |
| 14 | 4-vinyl pyridine | chloro-acetonitrile | Method 1 | Odor of HCN gas |
| 15 | 4-vinyl pyridine | 2-methoxy-ethoxymethyl chloride | Method 1 | Very active |
| 16 | 4-vinyl pyridine | 2-chloroethyl ether | Method 4 | Active |
| 17 | 2-vinyl pyridine | 2-chloro-ethanol | Method 4 | Active; incomplete reaction |
| 18 | 2-vinyl pyridine | methyl tosylate | Method 2 and Method 3 | Relatively less active |
| 19 | 2-vinyl pyridine | $Me_2SO_4$ | Method 1 and Method 3 | Relatively less active; exothermic at room temperature |
| 20 | 4-vinyl pyridine | 1,3 dichloro propanol | Method 5 | Very active |

In Examples 2 and 3, the poly(4-vinyl pyridine) starting material had a molecular weight of 16,000. In examples 4-20, the reaction products were mixtures of polymer and monomer to varying degrees, as the products spontaneously polymerized after the quaternization reaction.

Example 21

Deposition from a Cu Bath Containing the Reaction Product of Poly(4-Vinyl Pyridine) and Dimethyl Sulfate of Example 2

The following electroplating bath was prepared:

| INGREDIENT | AMOUNT BASED ON BATH |
| --- | --- |
| Cu | 40 grams per liter |
| Sulfuric Acid | 10 grams per liter |
| ViaForm ® suppressor | 2 ml per liter |
| ViaForm ® accelerator | 9 ml per liter |
| Reaction product of Poly(poly(4-vinyl pyridine and dimethyl sulfate) | 4.5 mg per liter |
| Chloride ion | 50 mg/L |

The bath was added to a 267 mL Hull cell. A brass Hull cell panel/cathode was plated at 2 amperes for 3 minutes. The current density varied at different areas of the Hull Cell panel/cathode, from a low at some areas of about 2 milliamperes per square cm to a high at other areas of about 800 milliamperes per square cm. This plating bath produced a Cu deposit which was very bright and uniform across the entire plating range.

Example 22

Deposition from a Cu Bath Containing the Reaction Product of 4-Vinyl Pyridine and 2-Chloroethanol of Example 7

The following electroplating bath was prepared:

| INGREDIENT | AMOUNT BASED ON BATH |
| --- | --- |
| Cu | 40 grams per liter |
| Sulfuric Acid | 10 grams per liter |
| ViaForm ® suppressor | 2 ml per liter |
| ViaForm ® accelerator | 9 ml per liter |
| Reaction product of 4-vinyl pyridine and 2-chloroethanol | 3 mg per liter |
| Chloride ion | 50 mg per liter |

The bath was added to a 267 mL Hull cell. A brass Hull cell panel/cathode was plated at 2 amperes for 3 minutes. The current density varied at different areas of the Hull Cell panel/cathode, from a low at some areas of about 2 milliamperes per square cm to a high at other areas of about 800 milliamperes per square cm. This plating bath produced a Cu deposit which was very bright and uniform across the entire plating range.

Example 23

Deposition from a Cu Bath Containing the Reaction Product of 4-Vinyl Pyridine and Dimethyl Sulfate of Example 4

The following electroplating bath was prepared:

| INGREDIENT | AMOUNT BASED ON BATH |
| --- | --- |
| Cu | 40 grams per liter |
| Sulfuric Acid | 10 grams per liter |
| ViaForm ® suppressor | 2 ml per liter |
| ViaForm ® accelerator | 9 ml per liter |
| Reaction product of 4-vinyl pyridine and methyl sulfate | 12 mg per liter |
| Chloride ion | 50 mg per liter |

The bath was added to a 267 mL Hull cell. A brass Hull cell panel/cathode was plated at 2 amperes for 3 minutes. The current density varied at different areas of the Hull Cell panel/cathode, from a low at some areas of about 2 milliampere per square cm to a high at other areas of about 800 milliamperes per square cm. This plating bath produced a Cu deposit which was very bright and uniform across the entire plating range.

Example 24

Four patterned test wafers ($SiO_2$ with Ta barrier available under the designation QCD from Sematech) characterized by 180 nm width trenches were plated at 10 mA/cm$^2$ for 15 seconds each in solutions containing Cu ions (40 g/L), sulfuric acid (10 g/L), chloride ions (50 mg/L), ViaForm® suppressor (2 ml/L), ViaForm® accelerator (9 ml/L), and varying leveler characteristics.

Figure 2:
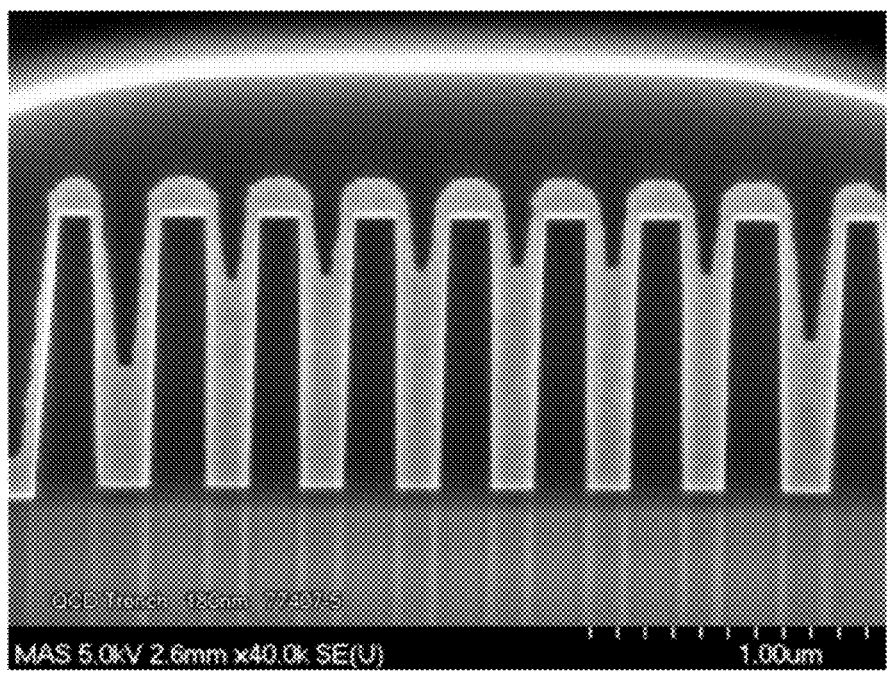
FIG. 2 is an SEM image of a cross-section of a wafer plated according to the method described in Example 24.
Figure 3:
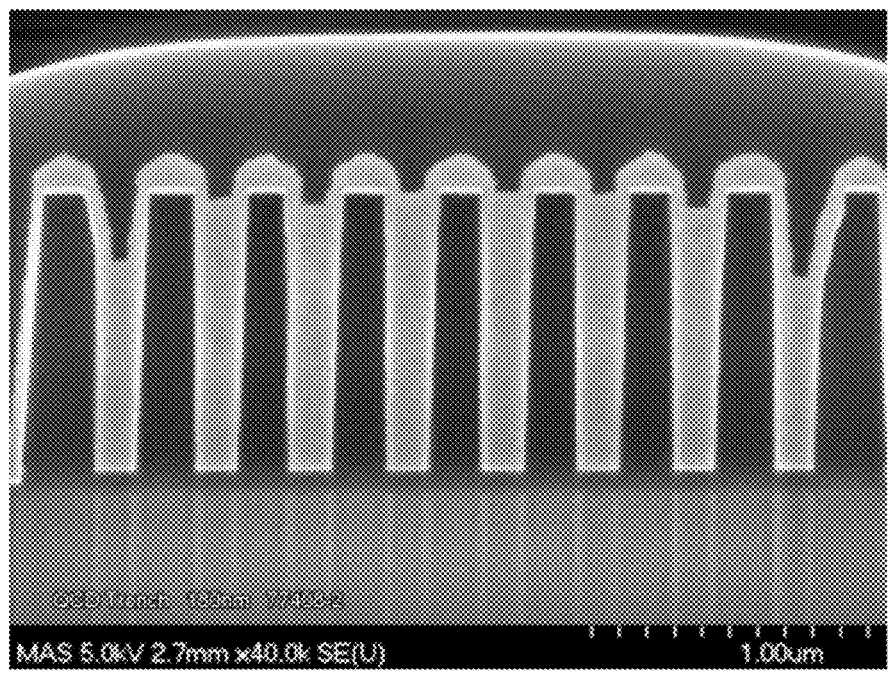
FIG. 3 is an SEM image of a cross-section of a wafer plated according to the method described in Example 24.

FIG. 1 illustrates a cross section of a wafer plated with no leveler; FIG. 2 illustrates a cross section of a wafer plated with 10 ml/L of a commercially available leveler; FIG. 3 illustrates a cross section of a wafer plated with 10 ml/L of a leveler constituting a polymer/monomer mix prepared according to the protocol of Example 4; and FIG. 4 illustrates a cross section of a wafer plated with 10 ml/L of a leveler constituting a polymer prepared according to the protocol of Example 2.

FIG. 1 shows a great quantity of superfilling in 15 seconds with no leveler, demonstrated by the position and U-shape geometry of growth front inside the feature. This indicates the bottom growth rate is significantly greater than the sidewall growth. With the addition of 10 ml/L of a commercially available leveler (FIG. 2), the growth front position is lower in the feature after 15 seconds, indicating slower overall fill commensurate with a significant degree of interference by the leveler with superfilling. Also, the geometry of the growth front is more V-shaped with the leveler, as contrasted with the generally U-shaped profile in FIG. 1 with no leveler. The leveler, therefore, interferes with superfilling to some extent.

Figure 4:
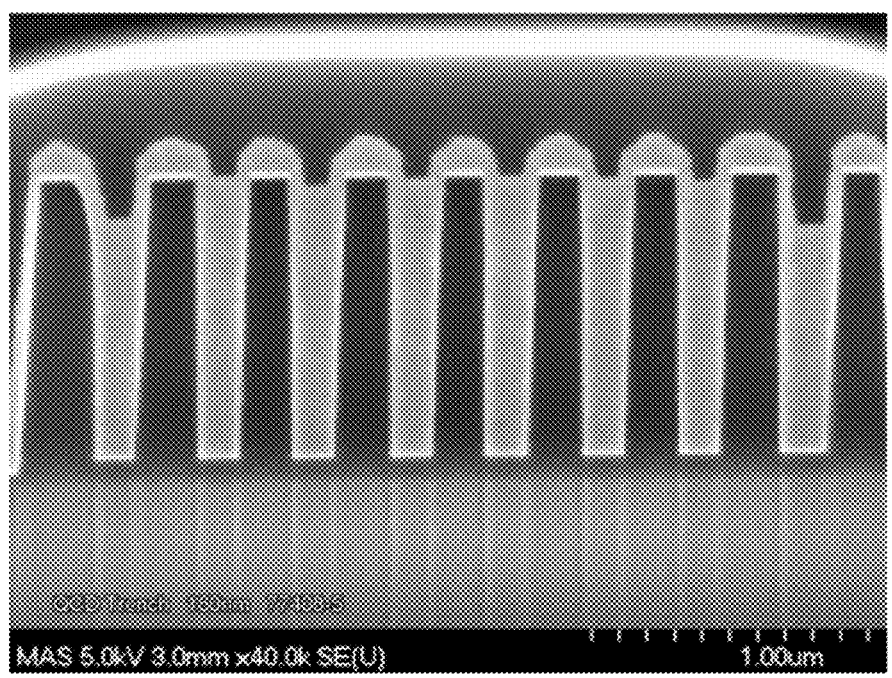
FIG. 4 is an SEM image of a cross-section of a wafer plated according to the method described in Example 24.

FIGS. 3 and 4 show an even greater quantity of fill in 15 seconds with two levelers of the invention of Examples 2 and 4. These levelers, therefore, do not substantially interfere with superfilling. These also show that, advantageously, an essentially rectangular fill profile with angles of substantially 90° between the bottom of the fill and the side walls through the entire filling process. In contrast, the fills of FIG. 2 (commercial leveler) show that a generally V-shaped fill profile begins forming prior to the interconnects' being on the order of 75% full. The more rectangular fill profile of FIGS. 3 and 4 is more advantageous because there is less risk of voiding and pinching off than with V-shaped fill profiles.

Example 25

Three test wafers (200 mm diameter; designation QCD from Sematech) characterized by 180 nm width trenches were plated each in a Sabre Copper Plating Tool available from Novellus in solutions containing Cu ions (40 g/L), sulfuric acid (10 g/L), chloride ions (50 mg/L), ViaForm® suppressor (2 ml/L), ViaForm® accelerator (9 ml/L), and no leveler.

Figure 5:
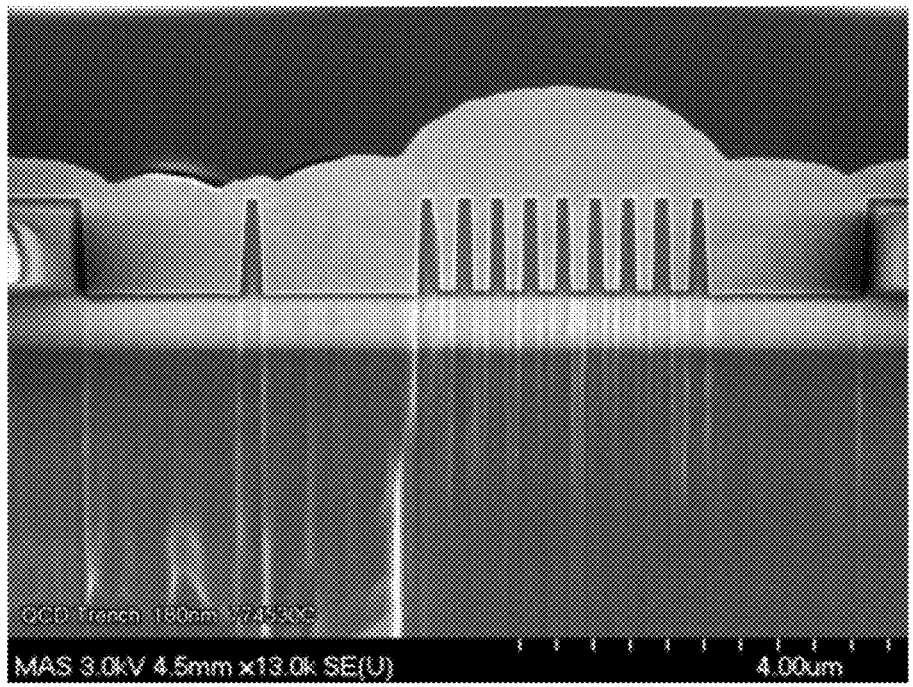
FIG. 5 is an SEM image of a cross-section of the center portion of a wafer plated according to the method described in Example 25.
Figure 6:
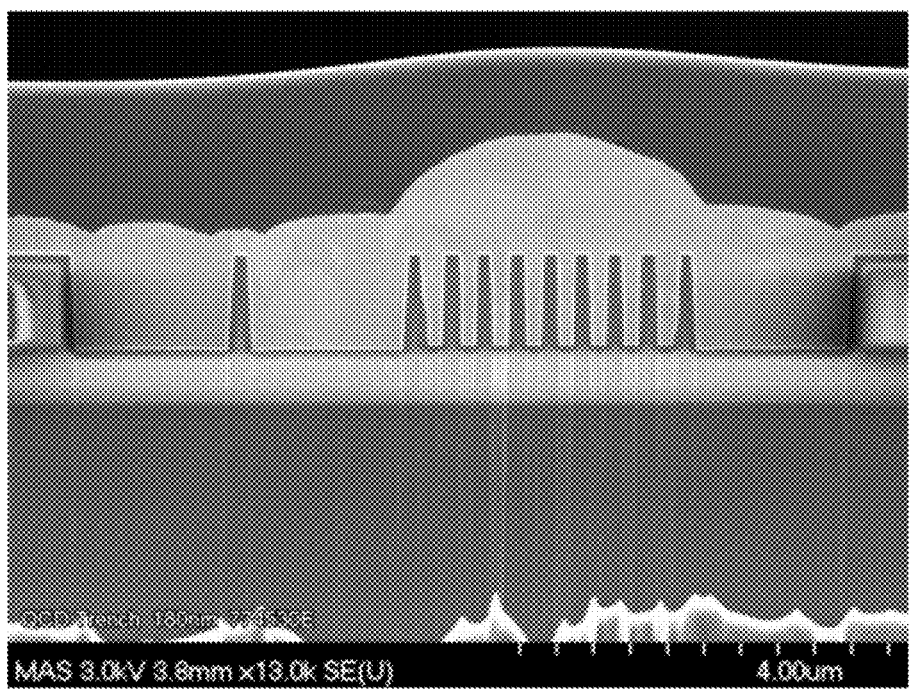
FIG. 6 is an SEM image of a cross-section of the edge portion of a wafer plated according to the method described in Example 25.
Figure 7:
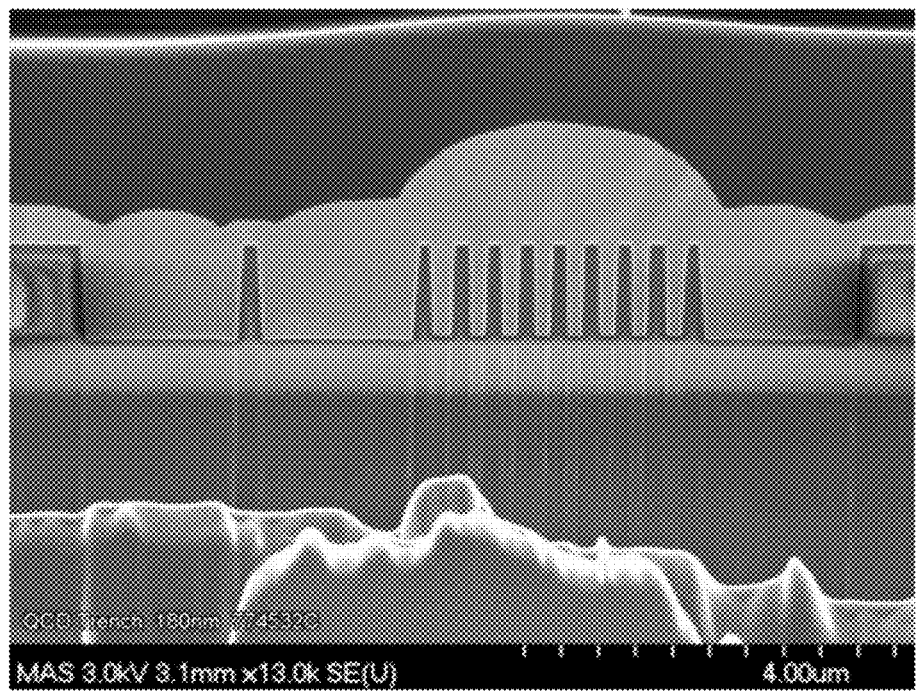
FIG. 7 is an SEM image of a cross-section of the center portion of a wafer plated according to the method described in Example 25.
Figure 8:
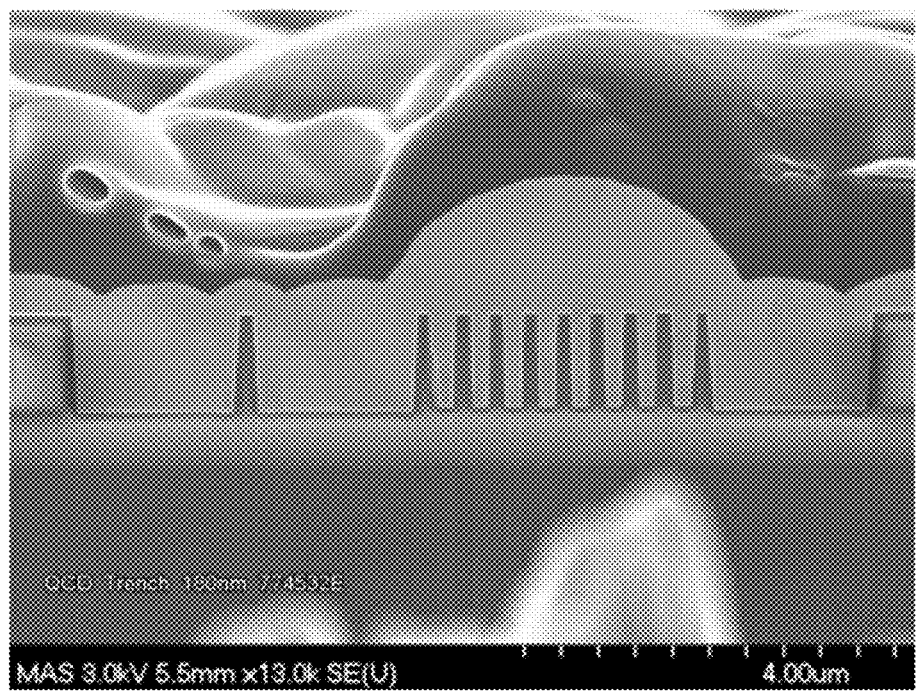
FIG. 8 is an SEM image of a cross-section of the edge portion of a wafer plated according to the method described in Example 25.
Figure 9:
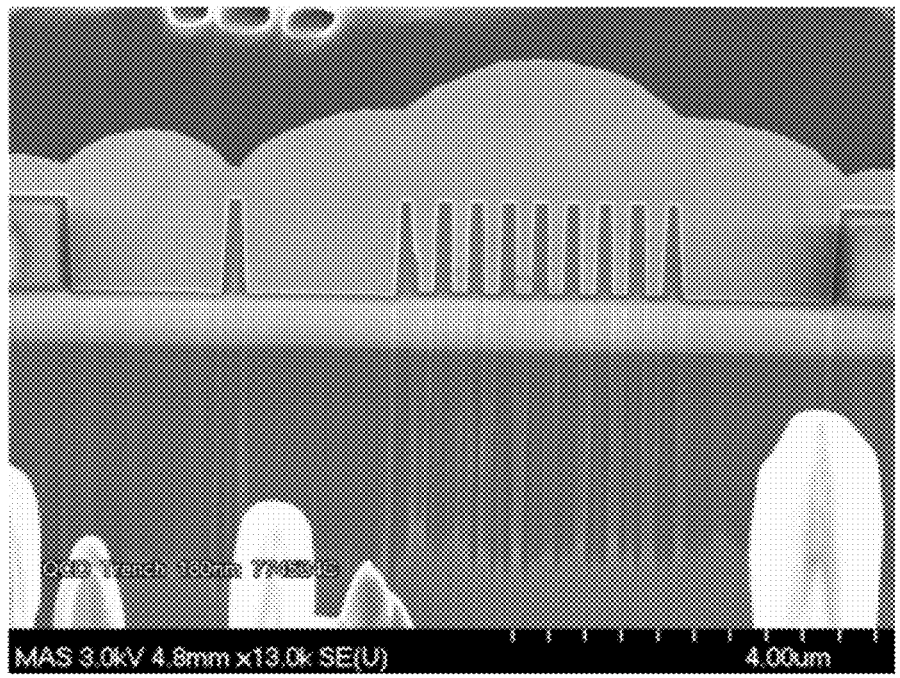
FIG. 9 is an SEM image of a cross-section of the center portion of a wafer plated according to the method described in Example 25.
Figure 10:
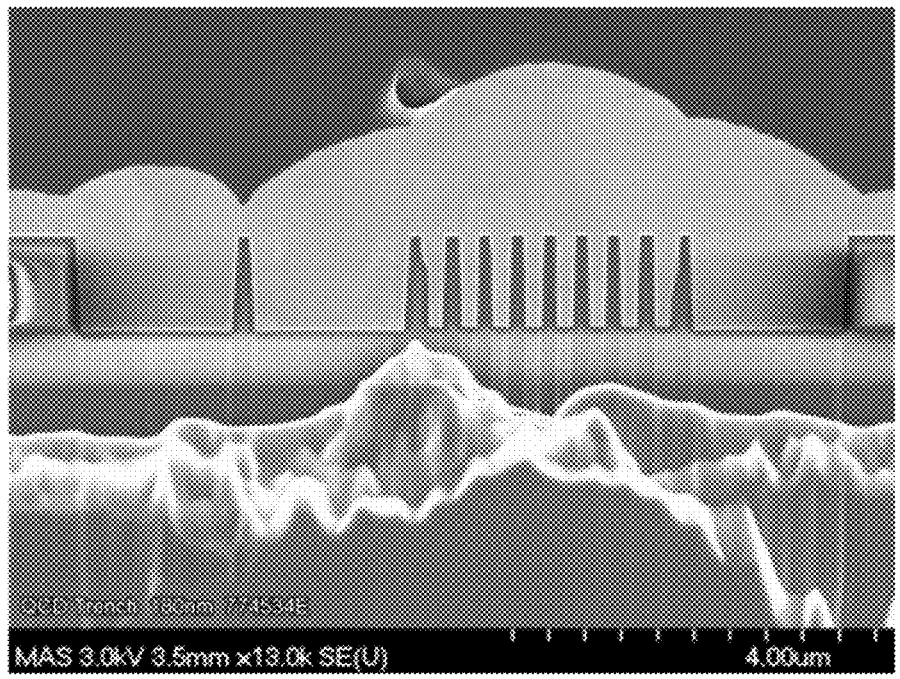
FIG. 10 is an SEM image of a cross-section of the edge portion of a wafer plated according to the method described in Example 25.

FIGS. 5 and 6 illustrate a cross section of a center (FIG. 5) and an edge (FIG. 6) of a wafer plated at a wafer rotation speed of 30 rpm, and a current of 3 A for 33 seconds followed by 18 A for 25 seconds. FIGS. 7 and 8 illustrate a cross section of a center (FIG. 7) and an edge (FIG. 8) of a wafer plated under these conditions at a wafer rotation speed of 125 rpm, and a current of 3 A for 33 seconds followed by 18 A for 25 seconds. FIGS. 9 and 10 illustrate a cross section of a center (FIG. 9) and an edge (FIG. 10) of a wafer plated under these conditions at a wafer rotation speed of 30 rpm, and a current of 1.5 A for 27 seconds followed by 3 A for 27 seconds followed by 12 A for 44 seconds.

Example 26

Three test wafers (200 mm diameter; designation QCD from Sematech) characterized by 180 nm width trenches were plated each in solutions containing Cu ions (40 g/L), sulfuric acid (10 g/L), chloride ions (50 mg/L), ViaForm® suppressor (2 ml/L), ViaForm® accelerator (9 ml/L), and 6 ml/L of a leveler constituting a polymer/monomer mix prepared according to the protocol of Example 4.

Figure 11:
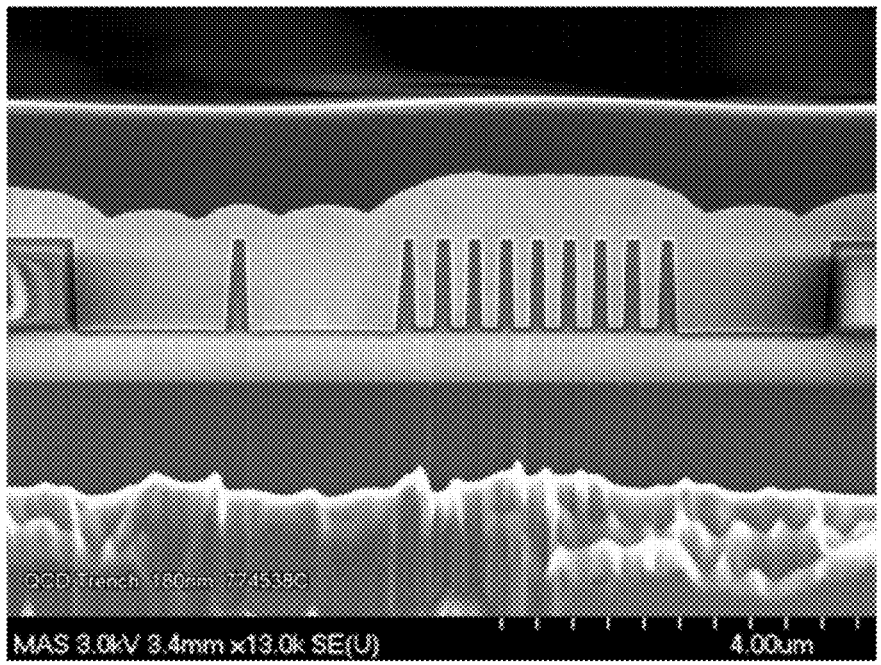
FIG. 11 is an SEM image of a cross-section of the center portion of a wafer plated according to the method described in Example 26.
Figure 12:
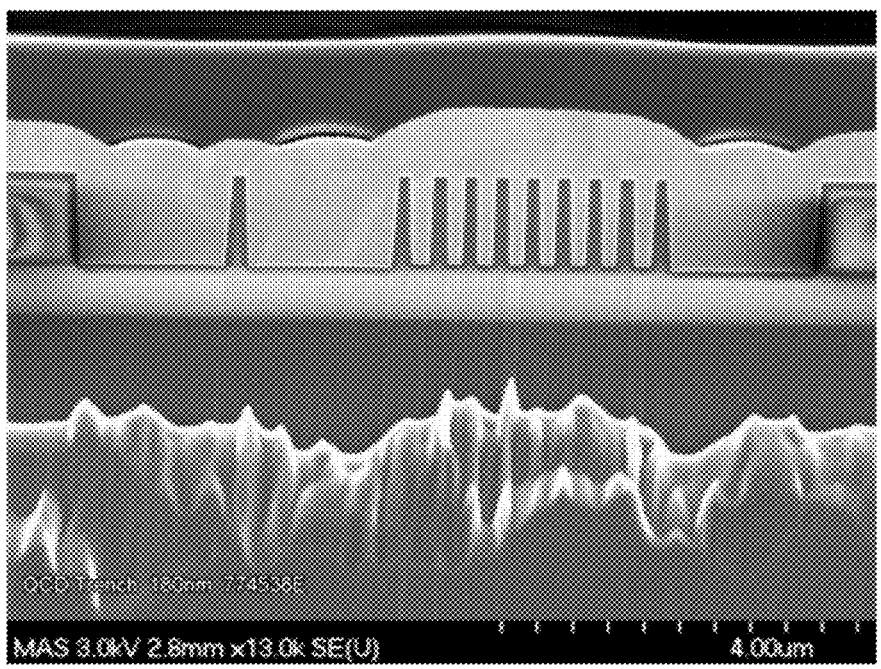
FIG. 12 is an SEM image of a cross-section of the edge portion of a wafer plated according to the method described in Example 26.
Figure 13:
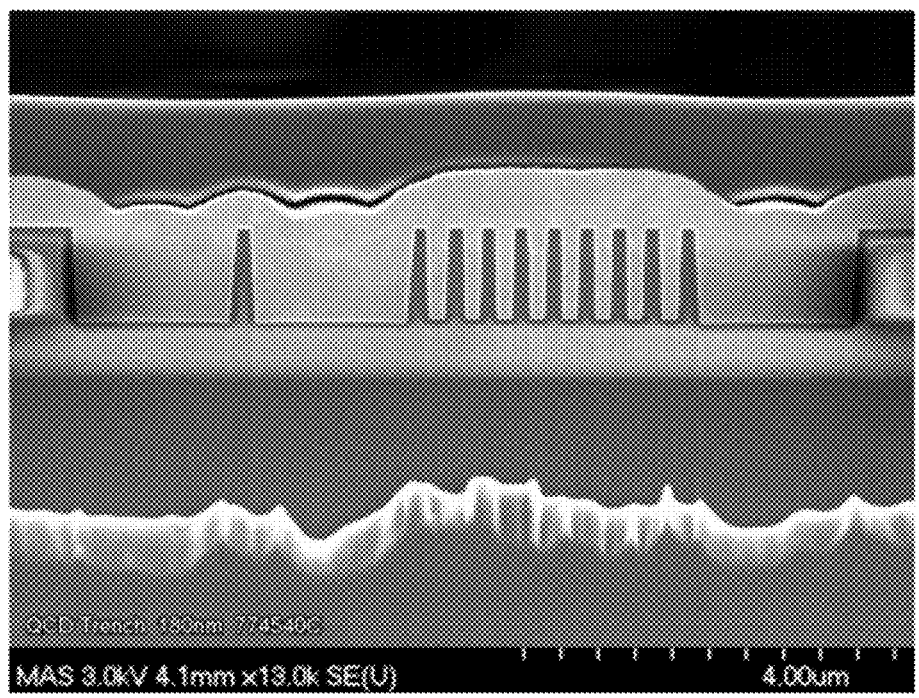
FIG. 13 is an SEM image of a cross-section of the center portion of a wafer plated according to the method described in Example 26.
Figure 14:
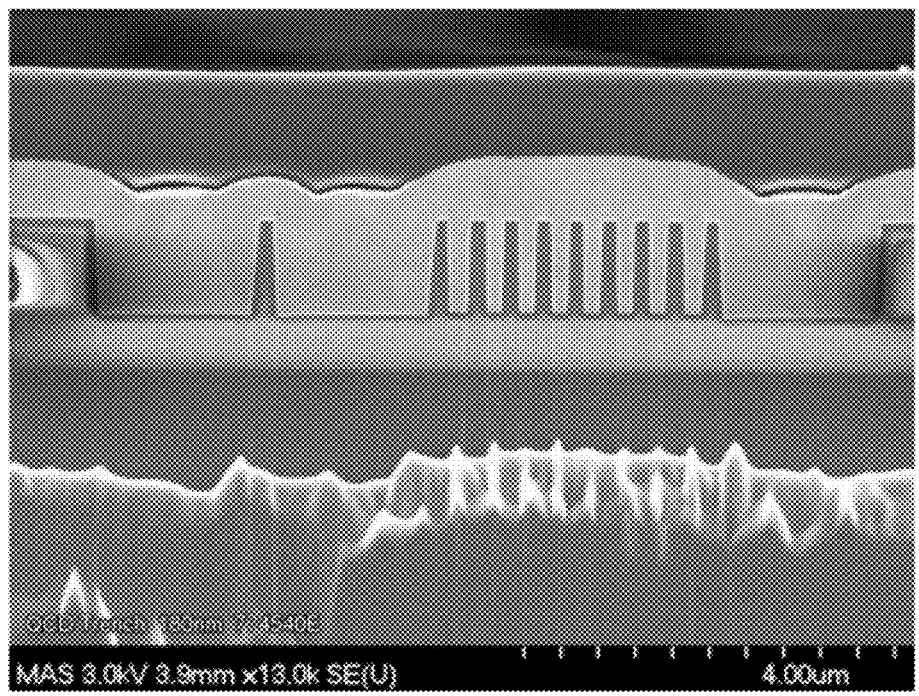
FIG. 14 is an SEM image of a cross-section of the edge portion of a wafer plated according to the method described in Example 26.
Figure 15:
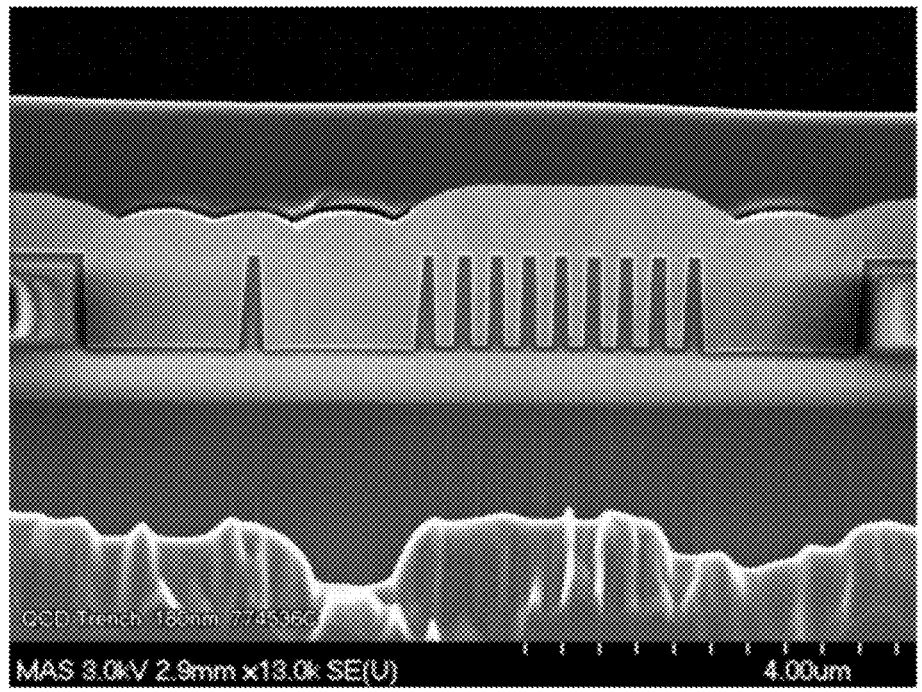
FIG. 15 is an SEM image of a cross-section of the center portion of a wafer plated according to the method described in Example 26.
Figure 16:
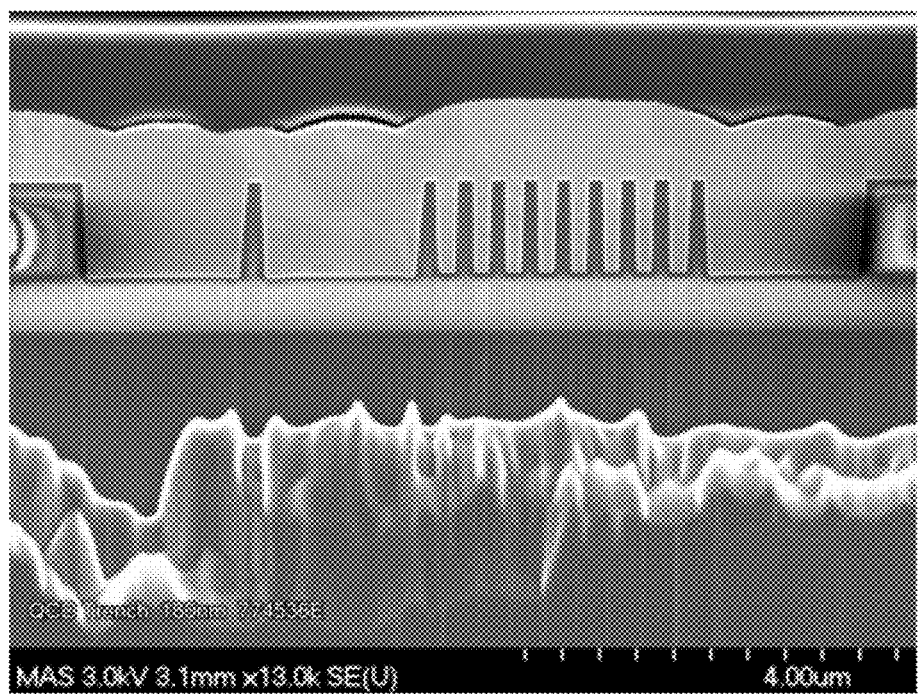
FIG. 16 is an SEM image of a cross-section of the edge portion of a wafer plated according to the method described in Example 26.

FIGS. 11 and 12 illustrate a cross section of a center (FIG. 11) and an edge (FIG. 12) of a wafer plated at a wafer rotation speed of 30 rpm, and a current of 3 A for 33 seconds followed by 18 A for 25 seconds. FIGS. 13 and 14 illustrate a cross section of a center (FIG. 13) and an edge (FIG. 14) of a wafer plated under these conditions at a wafer rotation speed of 125 rpm, and a current of 3 A for 33 seconds followed by 18 A for 25 seconds. FIGS. 15 and 16 illustrate a cross section of a center (FIG. 15) and an edge (FIG. 16) of a wafer plated under these conditions at a wafer rotation speed of 30 rpm, and a current of 1.5 A for 27 seconds followed by 3 A for 27 seconds followed by 12 A for 44 seconds.

Example 27

Three test wafers (200 mm diameter; designation QCD from Sematech) characterized by 180 nm width trenches were plated each in solutions containing Cu ions (40 g/L), sulfuric acid (10 g/L), chloride ions (50 mg/L), ViaForm® suppressor (2 ml/L), ViaForm® accelerator (9 ml/L), and 6 ml/L of a leveler constituting a polymer prepared according to the protocol of Example 2.

Figure 17:
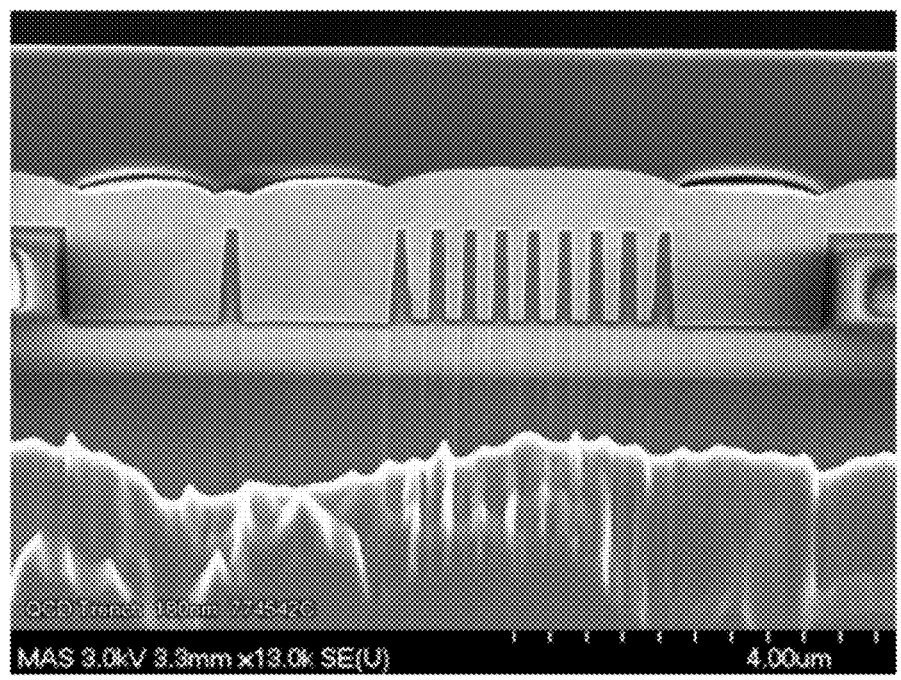
FIG. 17 is an SEM image of a cross-section of the center portion of a wafer plated according to the method described in Example 27.
Figure 18:
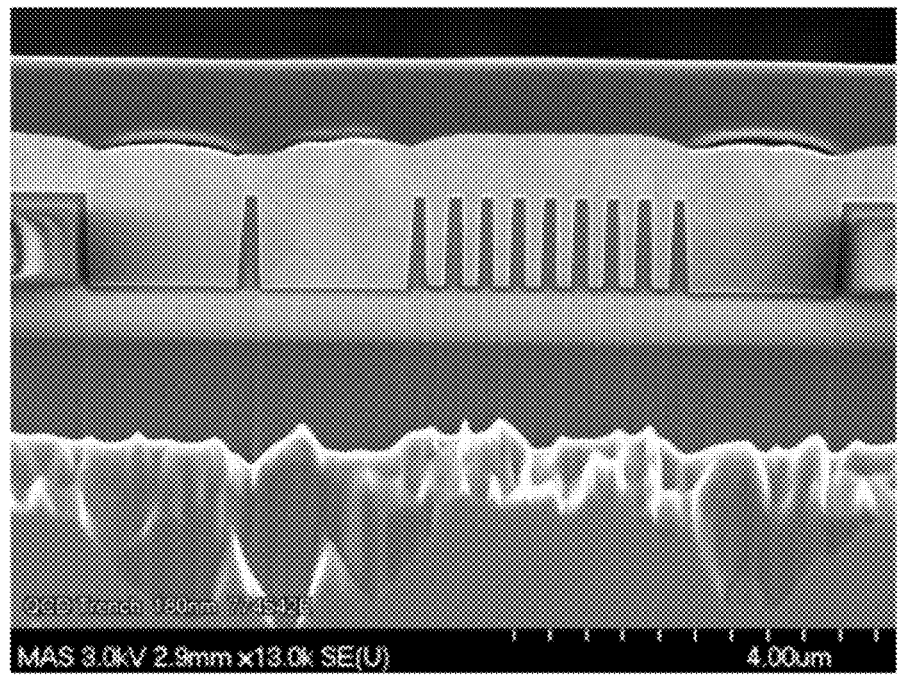
FIG. 18 is an SEM image of a cross-section of the edge portion of a wafer plated according to the method described in Example 27.
Figure 19:
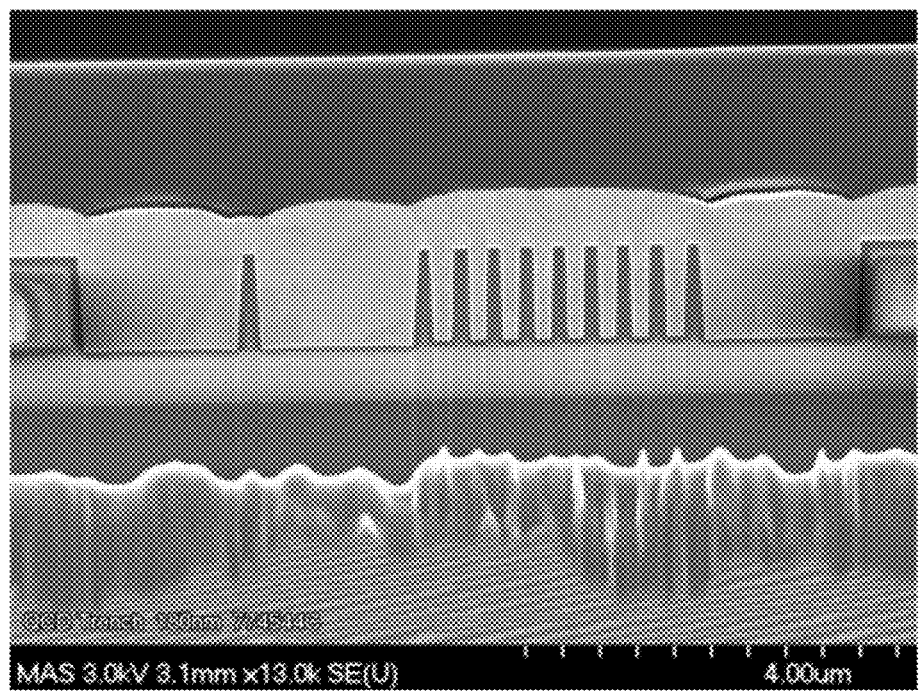
FIG. 19 is an SEM image of a cross-section of the center portion of a wafer plated according to the method described in Example 27.
Figure 20:
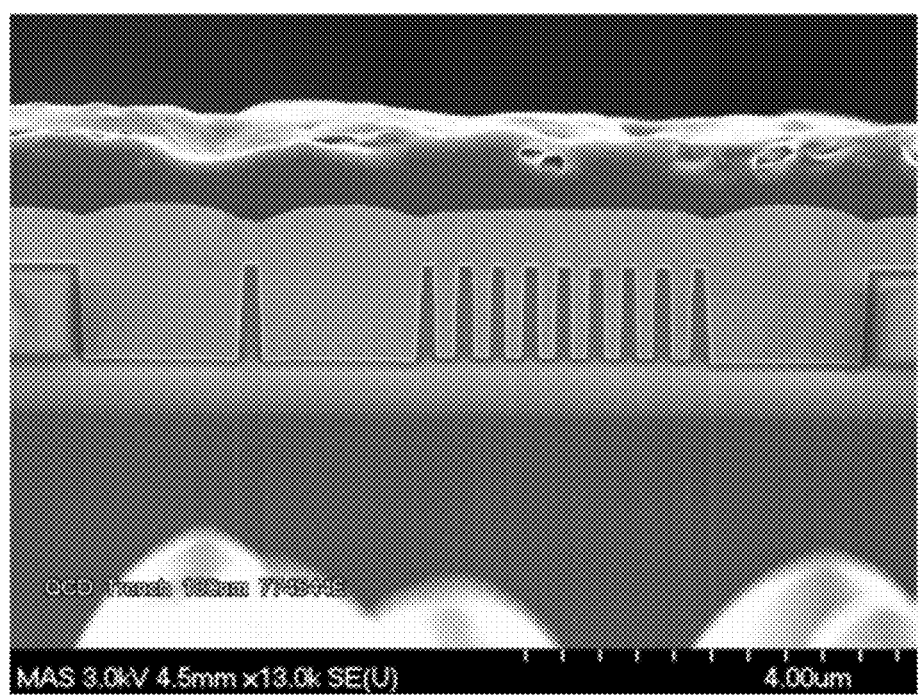
FIG. 20 is an SEM image of a cross-section of the edge portion of a wafer plated according to the method described in Example 27.
Figure 21:
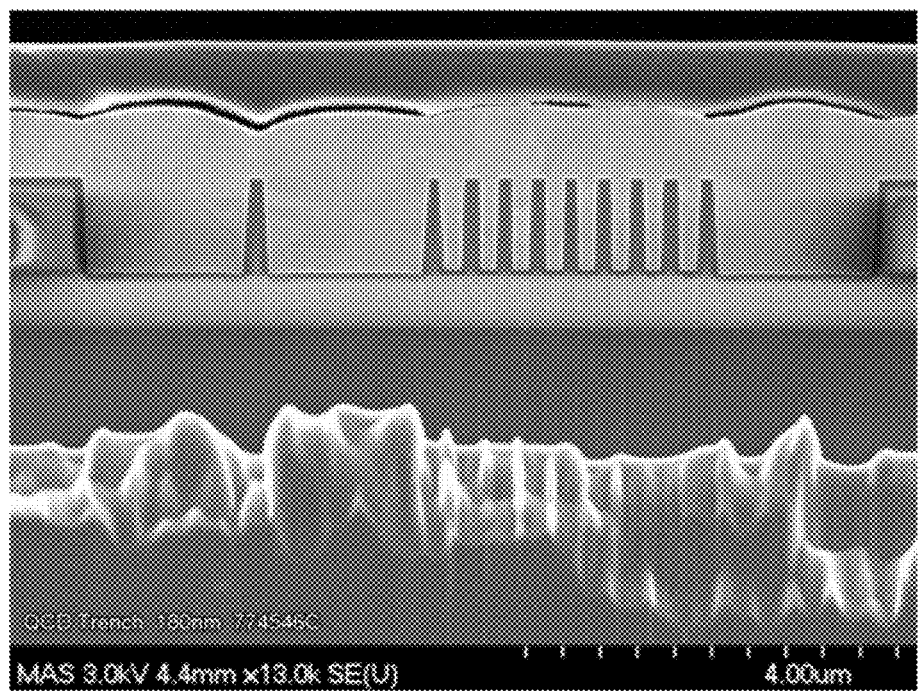
FIG. 21 is an SEM image of a cross-section of the center portion of a wafer plated according to the method described in Example 27.
Figure 22:
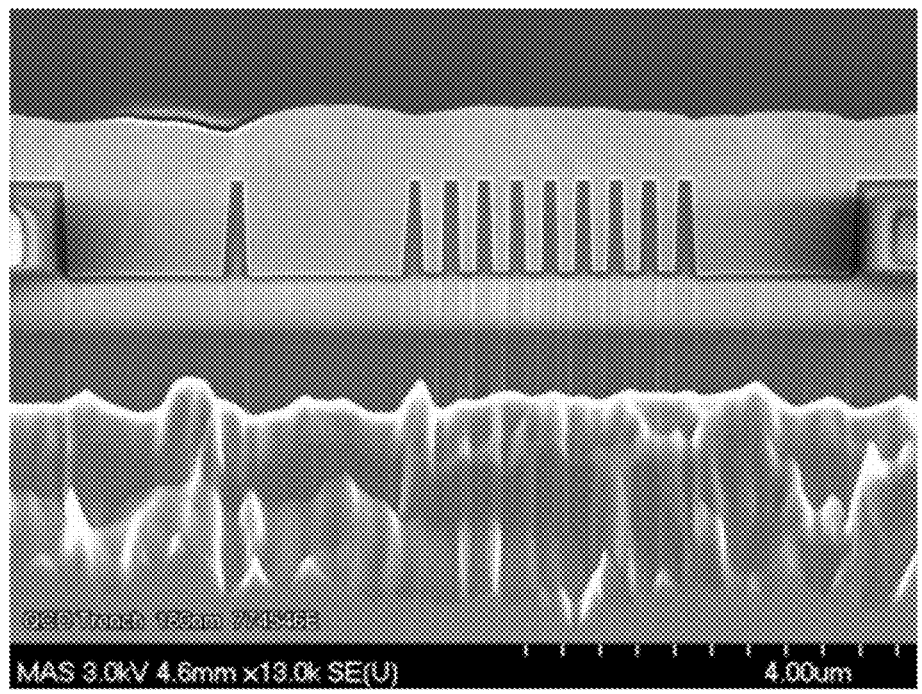
FIG. 22 is an SEM image of a cross-section of the edge portion of a wafer plated according to the method described in Example 27.

FIGS. 17 and 18 illustrate a cross section of a center (FIG. 17) and an edge (FIG. 18) of a wafer plated at a wafer rotation speed of 30 rpm, and a current of 3 A for 33 seconds followed by 18 A for 25 seconds. FIGS. 19 and 20 illustrate a cross section of a center (FIG. 19) and an edge (FIG. 20) of a wafer plated under these conditions at a wafer rotation speed of 125 rpm, and a current of 3 A for 33 seconds followed by 18 A for 25 seconds. FIGS. 21 and 22 illustrate a cross section of a center (FIG. 21) and an edge (FIG. 22) of a wafer plated under these conditions at a wafer rotation speed of 30 rpm, and a current of 1.5 A for 27 seconds followed by 3 A for 27 seconds followed by 12 A for 44 seconds.

Comparing the deposits of FIGS. 5-10 (no leveler) to those of FIGS. 11-16 (leveler of Ex. 4) and 17-22 (leveler of Ex. 2), the superior leveling characteristics of the invention are demonstrated, as overplating and mounding are substantially reduced. Without the leveling component, a significantly greater thickness of Cu must be deposited to achieve a sufficiently planar surface for subsequent CMP operations, which substantially increases the costs associated with both Cu plating and CMP processes.

When introducing elements of the present invention or the preferred embodiment(s) thereof, the articles "a", "an", "the" and "said" are intended to mean that there are one or more of the elements. For example, that the foregoing description and following claims refer to "an" interconnect means that there are one or more such interconnects. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense. The scope of invention is defined by the appended claims and modifications to the embodiments above may be made that do not depart from the scope of the invention.

DEFINITIONS

Unless otherwise indicated, the alkyl groups described herein are preferably lower alkyl containing from one to eight carbon atoms in the principal chain and up to 20 carbon atoms. They may be straight or branched chain or cyclic and include methyl, ethyl, propyl, isopropyl, butyl, hexyl, and the like.

Unless otherwise indicated, the alkenyl groups described herein are preferably lower alkenyl containing from two to eight carbon atoms in the principal chain and up to 20 carbon atoms. They may be straight or branched chain or cyclic and include ethenyl, propenyl, isopropenyl, butenyl, isobutenyl, hexenyl, and the like.

Unless otherwise indicated, the "substituted alkyl, or substituted alkenyl" moieties described herein are alkyl or alkenyl moieties which are substituted with at least one atom other than carbon, including moieties in which a carbon chain atom is substituted with a hetero atom such as nitrogen, oxygen, silicon, phosphorous, boron, sulfur, or a halogen atom. These substituents include halogen, heterocyclo, alkoxy, alkenoxy, alkynoxy, aryloxy, hydroxy, protected hydroxy, keto, acyl, acyloxy, nitro, amino, amido, cyano, thiol, ketals, acetals, esters, and ethers.

The terms "aryl" or "ar" as used herein alone or as part of another group denote optionally substituted homocyclic aromatic groups, preferably monocyclic or bicyclic groups containing from 6 to 12 carbons in the ring portion, such as phenyl, biphenyl, naphthyl, substituted phenyl, substituted biphenyl or substituted naphthyl. Phenyl and substituted phenyl are the more preferred aryl.

The term "aralkyl" as used herein alone or as part of another group denotes optionally substituted homocyclic aromatic groups wherein a carbon of the aromatic group is attached directly to a carbon of an alkyl group and the aralkyl moiety is attached to the derivative through the alkyl group. The aromatic groups and alkyl groups comprising the aralkyl group are defined above.

The terms "halogen" or "halo" as used herein alone or as part of another group refer to chlorine, bromine, fluorine, and iodine.

Unless otherwise indicated, the term "heteroarylalkyl" designates a heteroaryl group as defined herein attached to an alkyl group as defined herein which acts as a linker group to the rest of the molecule.

The term "heteroaryl" as used herein alone or as part of another group denote optionally substituted aromatic groups having at least one heteroatom in at least one ring, and preferably 5 or 6 atoms in each ring. The heteroaromatic group preferably has 1 or 2 oxygen atoms, 1 or 2 sulfur atoms, and/or 1 to 4 nitrogen atoms in the ring, and may be bonded to the remainder of the molecule through a carbon or heteroatom. Exemplary heteroaromatics include furyl, thienyl, pyridyl, oxazolyl, pyrrolyl, indolyl, quinolinyl, or isoquinolinyl and the like. Exemplary substituents include one or more of the following groups: hydrocarbyl, substituted hydrocarbyl, keto, hydroxy, protected hydroxy, acyl, acyloxy, alkoxy, alkenoxy, alkynoxy, aryloxy, halogen, amido, amino, nitro, cyano, thiol, ketals, acetals, esters, and ethers.

The term "acyl" as used herein alone or as part of another group, denotes the moiety formed by removal of the hydroxyl group from the group —COOH of an organic carboxylic acid, e.g., RC(O)—, wherein R is $R^1$, $R^1O—$, $R^1R^2N—$, or $R^1S—$, $R^1$ is hydrocarbyl, heterosubstituted hydrocarbyl, or heterocyclo and $R^2$ is hydrogen, hydrocarbyl, or substituted hydrocarbyl.

The term "acyloxy," as used herein alone or as part of another group, denotes an acyl group as described above bonded through an oxygen linkage (—O—), e.g., RC(O)O— wherein R is as defined in connection with the term "acyl."

What is claimed is:

1. A composition for electroplating Cu onto a substrate in the manufacture of a microelectronic device, the composition comprising:
    a source of Cu ions;
    one or more superfilling agent compounds which promote a Cu deposit characterized by a rate of growth in the vertical direction which is substantially greater than a rate of growth in the horizontal direction, wherein the superfilling agent compounds comprise an accelerator and a suppressor, and
    a leveling agent comprising a quaternized pyridyl polymer compound comprising a polymer of 4-vinyl pyridine which has a leveling effect without substantially interfering with superfilling.

2. The composition of claim 1 wherein said polymer of 4-vinyl pyridine is a 4-vinyl pyridine homo-polymer.

3. The composition of claim 1 wherein said polymer of 4-vinyl pyridine is a 4-vinyl pyridine co-polymer.

4. The composition of claim 1 wherein said polymer of 4-vinyl pyridine is a reaction product of 4-vinyl pyridine.

5. The composition of claim 1 wherein said polymer of 4-vinyl pyridine is a reaction product of poly(4-vinyl pyridine).

6. The composition of claim 1 wherein said polymer of 4-vinyl pyridine is a reaction product of 4-vinyl pyridine and methyl sulfate.

7. The composition of claim 1 wherein said polymer of 4-vinyl pyridine is a reaction product of poly(4-vinyl pyridine) and methyl sulfate.

8. The composition of claim 1 wherein said 4-vinyl pyridine polymer is prepared by a process that comprises a reaction between 4-vinyl pyridine and a compound of formula 1:

$$R_1—L \qquad (1)$$

wherein $R_1$ is alkyl, alkenyl, aralkyl, heteroarylalkyl, substituted alkyl, substituted alkenyl, substituted aralkyl or substituted heteroarylalkyl; and
L is a leaving group.

9. The composition of claim 1 wherein said 4-vinyl pyridine polymer is prepared by a process that comprises reacting poly(4-vinyl pyridine) with dimethyl sulfate, reacting poly(4-vinyl pyridine) with methyl tosylate, reacting 4-vinyl pyridine with dimethyl sulfate, reacting 4-vinyl pyridine with methyl tosylate, reacting 4-vinyl pyridine with 2-chloroethanol, reacting 4-vinyl pyridine with benzylchloride, reacting 4-vinyl pyridine with allyl chloride, reacting 4-vinyl pyridine with 4-chloromethylpyridine, reacting 4-vinyl pyridine with 1,3-propane sultone, reacting 4-vinyl pyridine with methyl tosylate, reacting 4-vinyl pyridine with chloroacetone, reacting 4-vinyl pyridine with 2-methoxyethoxymethylchloride, or reacting 4-vinyl pyridine with 2-chloroethylether.

10. A composition as set forth in claim 1 wherein said quaternized polymer of 4-vinyl pyridine comprises a quaternary pyridinium salt, the preparation of which comprises reaction of 4-vinyl pyridine or a polymer comprising repeating units of 4-vinyl pyridine with a compound selected from the group consisting of dimethyl sulfate, methyl tosylate, dimethyl sulfate, methyl tosylate, 2-chloroethanol, benzyl chloride, allyl chloride, chloromethylpyridine, 1,3-propane sultone, chloroacetone, methoxyethoxymethylchloride, 2-chloroethylether, poly(2-methyl-5-vinyl pyridine), and 1-methyl-4-vinylpyridinium trifluoromethyl sulfonate.

11. A composition as set forth in claim 10 wherein said 4-vinyl pyridine polymer is prepared by a process comprising reaction of 4-vinyl pyridine monomer or a polymer comprising 4-vinyl pyridine repeating units with dimethyl sulfate or methyl tosylate.

12. A composition for electroplating Cu onto a substrate in the manufacture of a microelectronic device, the composition comprising:
    a source of Cu ions;
    one or more superfilling agent compounds which promote a Cu deposit characterized by a rate of growth in the vertical direction which is substantially greater than a rate of growth in the horizontal direction, wherein the superfilling agent compounds are selected from the group consisting of an accelerator, a suppressor, and combinations thereof; and
    a leveling agent comprising a quaternized pyridyl polymer compound comprising a 4-vinyl pyridine polymer which has a leveling effect without substantially interfering with superfilling, wherein 4-vinyl pyridine repeating units of said 4-vinyl pyridine polymer have been quaternized with a quaternizing agent is selected from the group consisting of dimethyl sulfate, methyl tosylate, 2-chloroethanol, benzyl chloride, allyl chloride, chloroacetone, 2-methoxyethoxymethylchloride, 2-chloroethylether, 1,3-dichloropropanol, alkyl octyl sulfate, and alkyl trifluoromethane sulfonate.

13. A composition as set forth in claim 12 wherein said quaternizing agent is selected from the group consisting of dimethyl sulfate, methyl tosylate, chloroacetone, 2-chloroethylether, and 1,3-dichloropropanol.

* * * * *